(12) United States Patent
Koga

(10) Patent No.: US 11,353,792 B2
(45) Date of Patent: Jun. 7, 2022

(54) SUBSTRATE PROCESSING APPARATUS

(71) Applicant: Tokyo Electron Limited, Tokyo (JP)

(72) Inventor: Norihisa Koga, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 9 days.

(21) Appl. No.: 16/416,374

(22) Filed: May 20, 2019

(65) Prior Publication Data
US 2019/0361351 A1 Nov. 28, 2019

(30) Foreign Application Priority Data

May 22, 2018 (JP) .............................. JP2018-097663

(51) Int. Cl.
*G03F 7/20* (2006.01)
*G03F 7/40* (2006.01)

(52) U.S. Cl.
CPC .............. *G03F 7/2002* (2013.01); *G03F 7/40* (2013.01); *G03F 7/70933* (2013.01)

(58) Field of Classification Search
CPC ............. H01L 21/0274; H01L 21/0337; H01L 21/67115; H01L 21/67225; H01L 21/0273; H01L 21/67253; H01L 21/67017; H01L 21/027; H01L 21/67276; G03F 7/2002; G03F 7/2022; G03F 7/2024; G03F 7/2026; G03F 7/2051; G03F 7/2004; G03F 2007/2067; G03F 7/40; G03F 7/38; G03F 7/405; G03F 7/168; G03F 7/7008; G03F 7/70016; G03F 7/7005; G03F 7/70091; G03F 7/70141; G03F 7/7015; G03F 7/70191; G03F 7/70375; G03F 7/704; G03F 7/70408; G03F 7/7055; G03F 7/70383; G03F 7/70608; G03F 7/708; G03F 7/70808; G03F 7/70825; G03F 7/70841; G03F 7/70858; G03F 7/70866; G03F 7/70883; G03F 7/70908; G03F 7/70916; G03F 7/70925; G03F 7/70933; G03F 7/70991; G03F 7/70033
USPC .......... 355/30, 52–55, 67–74, 77; 250/492.1, 250/492.2, 492.22, 494.1, 504 R, 548;
(Continued)

(56) References Cited

U.S. PATENT DOCUMENTS 5,215,588 A * 6/1993 Rhieu ............... C23C 16/45519
   118/715
6,222,610 B1 * 4/2001 Hagiwara ........... G03F 7/70858
   355/30

(Continued)

FOREIGN PATENT DOCUMENTS

JP          06020959 A  *  1/1994
JP       2001-127037 A     5/2001
(Continued)

*Primary Examiner* — Christina A Riddle
(74) *Attorney, Agent, or Firm* — Abelman, Frayne & Schwab

(57) ABSTRACT

A substrate processing apparatus includes: a processing chamber configured to process a substrate; a light source chamber including a light source configured to irradiate vacuum ultraviolet light onto a surface of the substrate; a gas supply configured to supply an inert gas into the light source chamber; and a controller that controls the gas supply to maintain the light source chamber in an inert gas atmosphere.

17 Claims, 12 Drawing Sheets

(58) Field of Classification Search
USPC .............. 264/220; 427/259; 430/5, 30, 22, 430/311–319, 327, 328
See application file for complete search history.

(56) References Cited

U.S. PATENT DOCUMENTS

| | | | | |
|---|---|---|---|---|
| 6,631,726 | B1* | 10/2003 | Kinoshita | B08B 7/00 |
| | | | | 134/1 |
| 2001/0052967 | A1* | 12/2001 | Ogura | G03F 7/70883 |
| | | | | 355/53 |
| 2016/0282725 | A1* | 9/2016 | Miyagi | H01L 21/67225 |
| 2016/0322241 | A1* | 11/2016 | Matsushita | F26B 3/30 |

FOREIGN PATENT DOCUMENTS

| | | | |
|---|---|---|---|
| JP | 2006-239604 A | 9/2006 |
| JP | 2008-043925 A | 2/2008 |
| JP | 2012-004144 A | 1/2012 |

\* cited by examiner

SUBSTRATE PROCESSING APPARATUS

CROSS-REFERENCE TO RELATED APPLICATION

This application is based on and claims priority from Japanese Patent Application No. 2018-097663, filed on May 22, 2018 with the Japan Patent Office, the disclosure of which is incorporated herein in its entirety by reference.

TECHNICAL FIELD

The present disclosure relates to a substrate processing apparatus.

BACKGROUND

Japanese Patent Laid-Open Publication No. 2001-127037 discloses a method of forming a fine pattern in a semiconductor device manufacturing process, the method including: forming a resist film on a surface of a substrate; exposing a resist film; patterning a resist film; irradiating a light having a wavelength of 200 nm or less on a surface of a resist pattern; and etching the surface of the substrate using the resist pattern as a mask. The roughness (unevenness) on the surface of the resist pattern is improved by irradiating the resist pattern with light having a wavelength of 200 nm or less.

SUMMARY

A substrate processing apparatus according to an embodiment includes: a processing chamber configured to perform a processing on a substrate; a light source chamber including a light source configured to irradiate vacuum ultraviolet light onto a surface of the substrate; a gas supply configured to supply an inert gas into the light source chamber; and a controller configured to control the gas supply to maintain the light source chamber in an inert gas atmosphere.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

DETAILED DESCRIPTION

Figure 1:
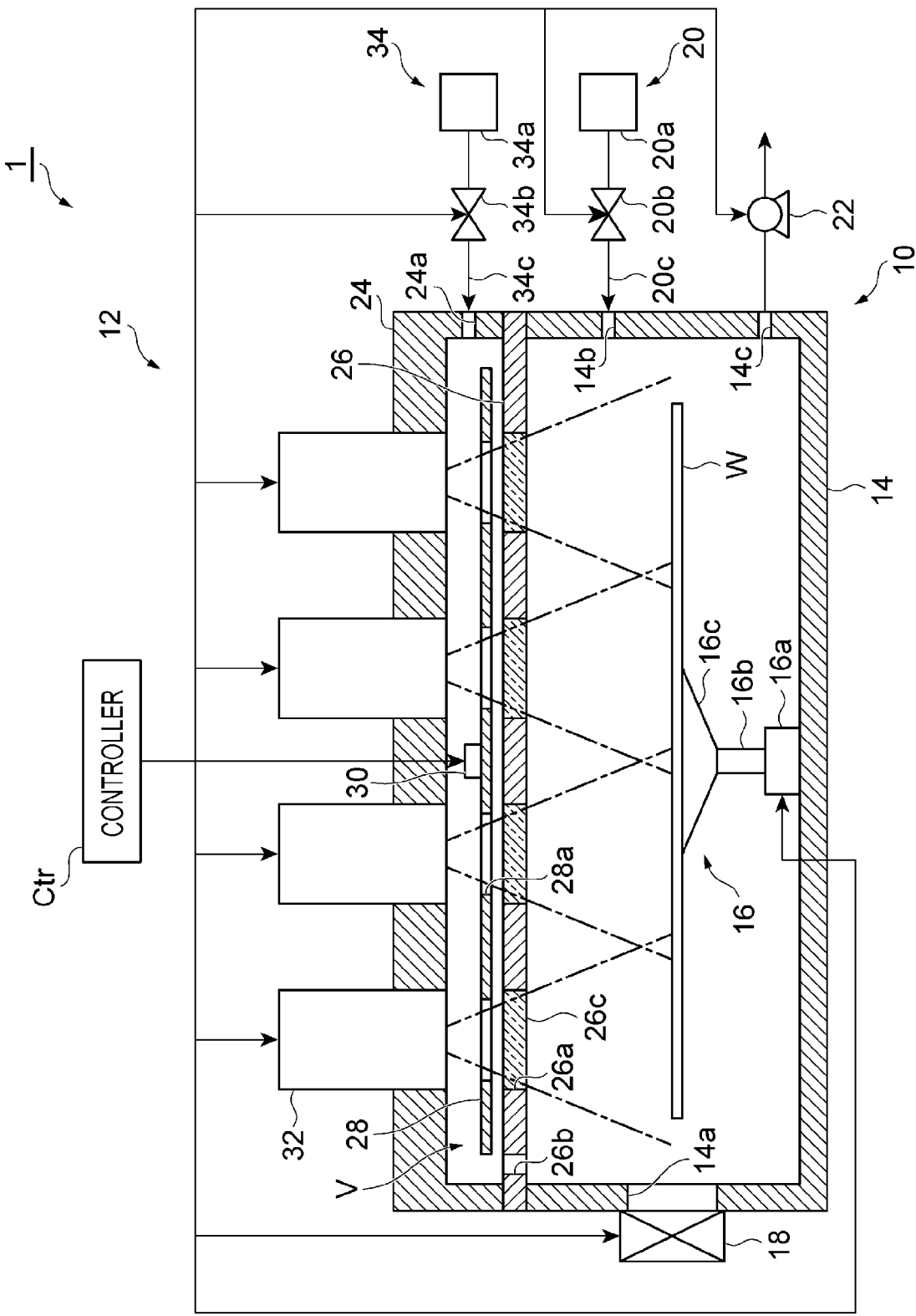
FIG. 1 is a view illustrating a substrate processing apparatus according to an embodiment.

In the following detailed description, reference is made to the accompanying drawings, which form a part thereof. The illustrative embodiments described in the detailed description, drawings, and claims are not meant to be limiting. Other embodiments may be utilized, and other changes may be made without departing from the spirit or scope of the subject matter presented here.

Hereinafter, embodiments of the present disclosure will be described with reference to the accompanying drawings. In the accompanying drawings, the same or corresponding members or parts are denoted by the same or corresponding reference numerals, and redundant explanations thereof are omitted.

<Configuration of Substrate Processing Apparatus>

An example of a substrate processing apparatus 1 will be described with reference to FIGS. 1 to 5. The substrate processing apparatus 1 is configured to perform a predetermined process on a wafer W (substrate). For example, the substrate processing apparatus 1 is configured to irradiate vacuum ultraviolet light (VUV light) onto a resist film or a resist pattern formed on the surface of the wafer W so as to improve the surface roughness of these resist materials. The substrate processing apparatus 1 may irradiate vacuum ultraviolet light onto the resist materials after exposure.

The wafer W may have a disc shape or a plate shape other than a circular shape such as a polygon. The wafer W may have a cutaway portion that is partially cut away. The cutaway portion may be, for example, a notch (a U-shaped groove, a V-shaped groove, etc.) or a linearly extending straight portion (so-called orientation/flat). The wafer W may be, for example, a semiconductor substrate, a glass substrate, a mask substrate, a flat panel display (FPD) substrate, or other various substrates. The diameter of the wafer W may be, for example, about 200 mm to 450 mm As illustrated in FIG. 1, the substrate processing apparatus 1 includes a processing chamber 10, a light source chamber 12, and a controller Ctr.

The processing chamber 10 includes a housing 14, a rotation holder 16, a gate valve 18, a gas supply 20, and a vacuum pump 22 (exhaust unit). The housing 14 is, for example, a part of a vacuum container provided in the atmosphere, and is configured to be able to accommodate the wafers W transferred by a transfer mechanism (not illustrated). The housing 14 represents a bottomed cylindrical body opened upward. Through holes 14a to 14c are formed in the wall surface of the housing 14.

The rotation holder 16 includes a rotating unit 16a, a shaft 16b, and a holding unit 16c. The rotating unit 16a operates based on an operation signal from the controller Ctr to rotate the shaft 16b. The rotating unit 16a is, for example, a power source such as an electric motor. The holding unit 16c is provided at the tip portion of the shaft 16b. The holding unit 16c may hold the wafer W in a state in which the posture of the wafer W is substantially horizontal. When the rotating unit 16a rotates while the wafer W is mounted on the holding unit 16c, the wafer W rotates around an axis perpendicular to the surface (rotational axis).

The gate valve 18 is disposed on the outer surface of the side wall of the housing 14. The gate valve 18 is configured to operate based on an instruction of the controller Ctr, and close and open the through hole 14a of the housing 14. When the through hole 14a is opened by the gate valve 18, the wafer W may be carried into and out of the housing 14. That is, the through hole 14a also functions as an entrance and an exit of the wafer W.

The gas supply 20 is configured to supply an inert gas (e.g., argon or nitrogen) into the housing 14 through the through hole 14b. The gas supply 20 includes a gas source 20a, a valve 20b, and a pipe 20c. The gas source 20a stores an inert gas and functions as the source of the inert gas. The valve 20b operates based on an operation signal from the controller Ctr to open and close the pipe 20c. The pipe 20c connects the gas source 20a, the valve 20b, and the through hole 14b sequentially from the upstream side.

The vacuum pump 22 is configured to exhaust gas from the inside of the housing 14 and make the inside of the housing 14 in a vacuum state.

The light source chamber 12 includes a housing 24, a partition wall 26, a shutter 28, an actuator 30, a plurality of light sources 32, and a gas supply 34.

The housing 24 is, for example, a part of a vacuum container provided in an air atmosphere. The housing 24 represents a bottomed cylindrical body opened downward. The housing 24 is disposed such that the open end of the housing 24 faces the open end of the housing 14. The through hole 24a is formed on the wall surface of the housing 24.

The partition wall 26 is disposed between the housings 14 and 24 and configured to partition the space in the housing 14 and the space in the housing 24. In other words, the partition wall 26 functions as the upper wall of the housing 14 and also functions as the bottom wall of the housing 24. That is, the housing 24 is disposed adjacent to the housing 14 in the direction perpendicular to the surface of the wafer W (hereinafter, the vertical direction). A space V in the housing 24 formed after being partitioned by the partition wall 26 is a flat space whose height in the vertical direction is smaller than the size in the horizontal direction.

Figure 2:
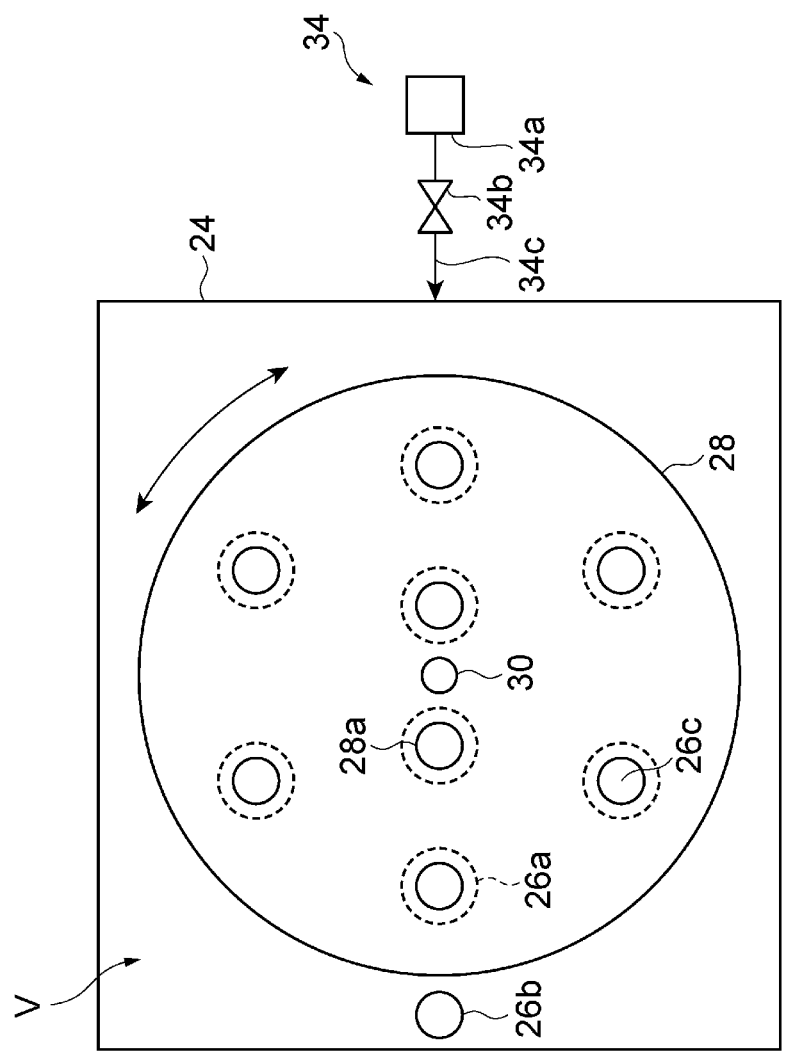
FIG. 2 is a view of a lamp chamber of the substrate processing apparatus of FIG. 1 as viewed from above, illustrating a state where a light passage window is not closed by a shutter.
Figure 3:
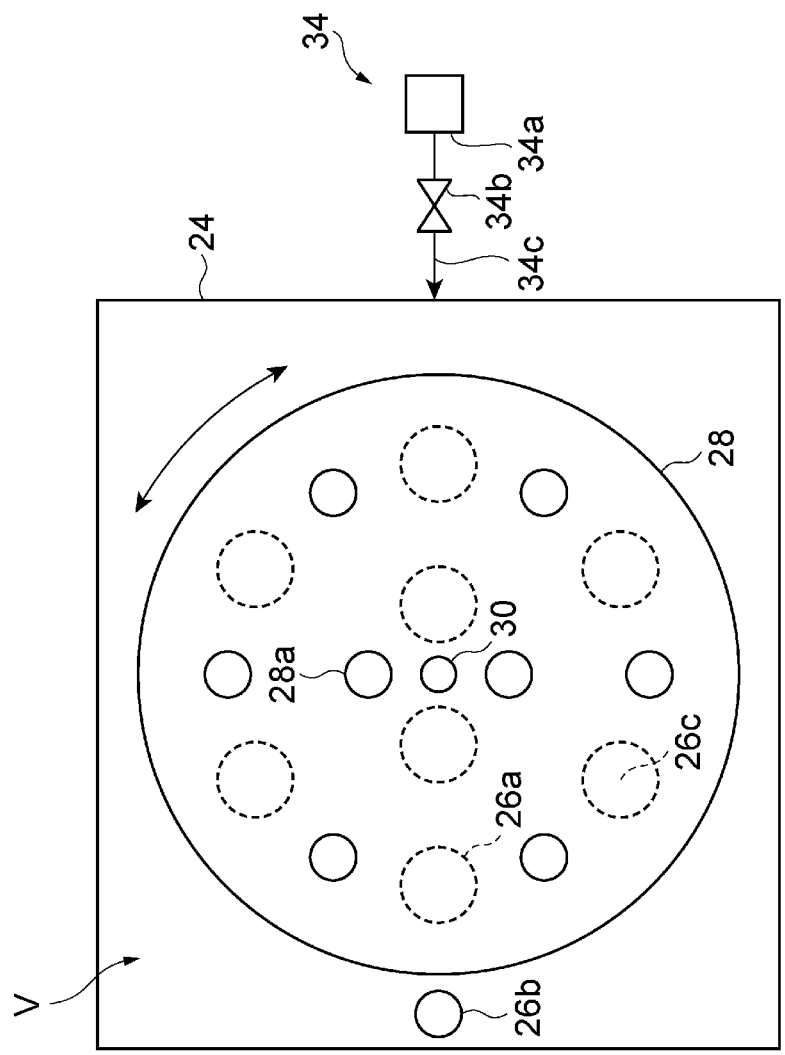
FIG. 3 is a view of the lamp chamber of the substrate processing apparatus of FIG. 1 as viewed from above, illustrating a state where the light passage window is closed by the shutter.

The partition wall 26 is provided with a plurality of through holes 26a and a through hole 26b. The plurality of through holes 26a are arranged to overlap the shutter 28 in the vertical direction, as illustrated in FIG. 2. Each of the plurality of through holes 26a is closed by a window member 26c that may transmit vacuum ultraviolet light, as illustrated in FIGS. 1 and 2. The window member 26c may be, for example, glass (e.g., magnesium fluoride glass). The through hole 26b is located away from the through hole 24a. The through hole 26b is not closed by, for example, the window member 26c, and constitutes a flow path through which gas may flow.

The shutter 28 is disposed in the space V, and is configured to be able to block and pass through vacuum ultraviolet light emitted by the light source 32. The shutter 28 represents a disk shape, as illustrated in FIG. 2. The shutter 28 is formed with a plurality of through holes 28a.

The actuator 30 is connected near the center of the shutter 28 as illustrated in FIGS. 1 and 2. The actuator 30 is configured to rotate the shutter 28 based on an instruction from the controller Ctr. More specifically, the actuator 30 has a function of rotating the shutter 28 between an open position in which each through hole 28a overlaps in the vertical direction with the corresponding through hole 26a (window member 26c) (see, e.g., FIG. 2), and a closed position in which each through hole 28a does not overlap in the vertical direction with the corresponding through hole 26a (window member 26c) (see, e.g., FIG. 3).

The plurality of light sources 32 are attached to the upper wall of the housing 24. The plurality of light sources 32 are configured to irradiate vacuum ultraviolet light downward based on an instruction from the controller Ctr. Each of the plurality of light sources 32 is disposed so as to overlap in the vertical direction with the through hole 26a (window member 26c) as illustrated in FIG. 1. Therefore, when the shutter 28 is in the open position, the vacuum ultraviolet light irradiated from each light source 32 passes through the corresponding through hole 28a and the through hole 26a (window member 26c) to be irradiated on the surface of the wafer W in the housing 14. Meanwhile, when the shutter 28 is in the closed position, the vacuum ultraviolet light irradiated from each light source 32 is blocked by the shutter 28 and is not irradiated into the housing 14.

Each light source 32 is, for example, a deuterium lamp, and may be configured to irradiate vacuum ultraviolet light having a wavelength of 200 nm or less. More specifically, each light source 32 may be configured to irradiate light having a wavelength of, for example, 115 nm to 400 nm, that is, light having a continuous spectrum of 115 nm to 400 nm. The continuous spectrum in this range includes light having a wavelength of 10 nm to 200 nm (i.e., vacuum ultraviolet light) and near ultraviolet light having a wavelength larger than that of vacuum ultraviolet light (near ultraviolet light). The wavelength of the peak of the continuous spectrum may be, for example, 160 nm or less, or 150 nm or more.

Since the wavelength range of the spectrum of the light irradiated from each light source 32 is relatively broad, the resist material on the surface of the wafer W receives various types of light energy. As a result, various reactions occur on the surface of the resist material. Specifically, since chemical bonds at various positions in molecules constituting the resist material are cleaved to generate various compounds, the orientation of the molecules present in the resist material before light irradiation is resolved, and the surface free energy of the resist material is reduced, thereby reducing the internal stress. As a result, the fluidity of the surface of the resist material is increased. Therefore, the effect of improving the surface roughness of the wafer W may be enhanced.

The light irradiated onto the resist material is likely to reach the deep layer of the resist material as the wavelength is larger. In this respect, the peak wavelength of the spectrum of the light irradiated from each light source 32 is included in the bandwidth of vacuum ultraviolet light (10 nm to 200 nm) as described above. Thus, the intensity of light having a relatively large wavelength among the lights irradiated from each light source 32 is small. Therefore, the light irradiated from each light source 32 is less likely to reach the deep layer of the resist material. As a result, it is possible to suppress the cleavage of the bond of the molecules in the deep layer of the resist material. That is, the region that reacts by light irradiation may be limited to the surface side of the resist material.

Each light source 32 may generate the top hat type light having a flat intensity distribution as compared to the light of Gaussian distribution. However, even in the case of the top hat type light, the intensity distribution is not made completely flat, and the light intensity becomes weaker as the light is separated from the central side (directly below the light source 32). The light irradiated from the light source 32 may have a conical light path.

The gas supply 34 is configured to supply an inert gas (e.g., nitrogen) into the housing 24 through the through hole 24*a*. The gas supply 34 includes a gas source 34*a*, a valve 34*b*, and a pipe 34*c*. The gas source 34*a* stores an inert gas and functions as a source of the inert gas. The valve 34*b* operates based on an operation signal from the controller Ctr to open and close the pipe 34*c*. The pipe 34*c* connects the gas source 34*a*, the valve 34*b*, and the through hole 14*b* sequentially from the upstream side.

Figure 4:
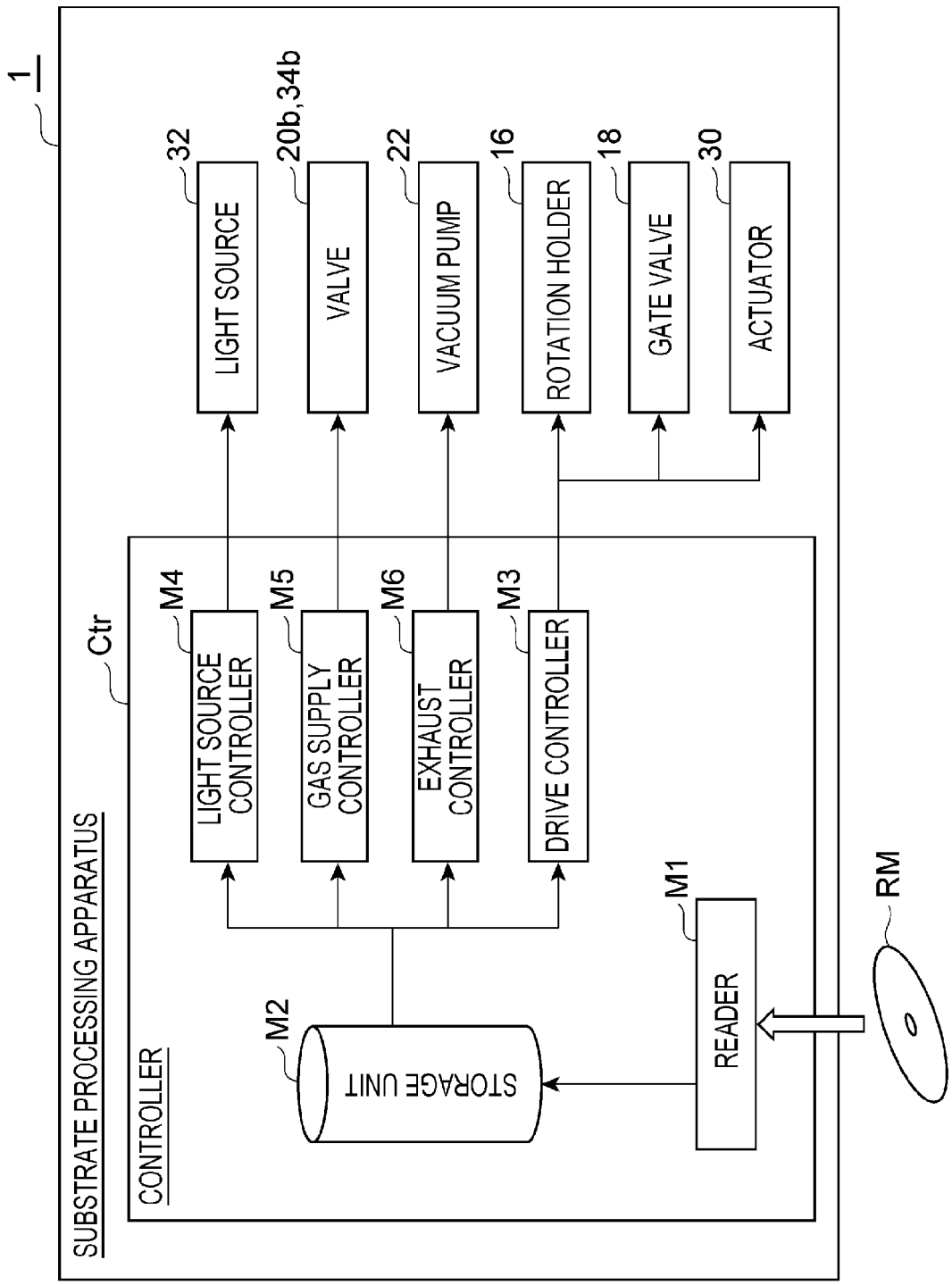
FIG. 4 is a block diagram illustrating a substrate processing apparatus.
Figure 5:
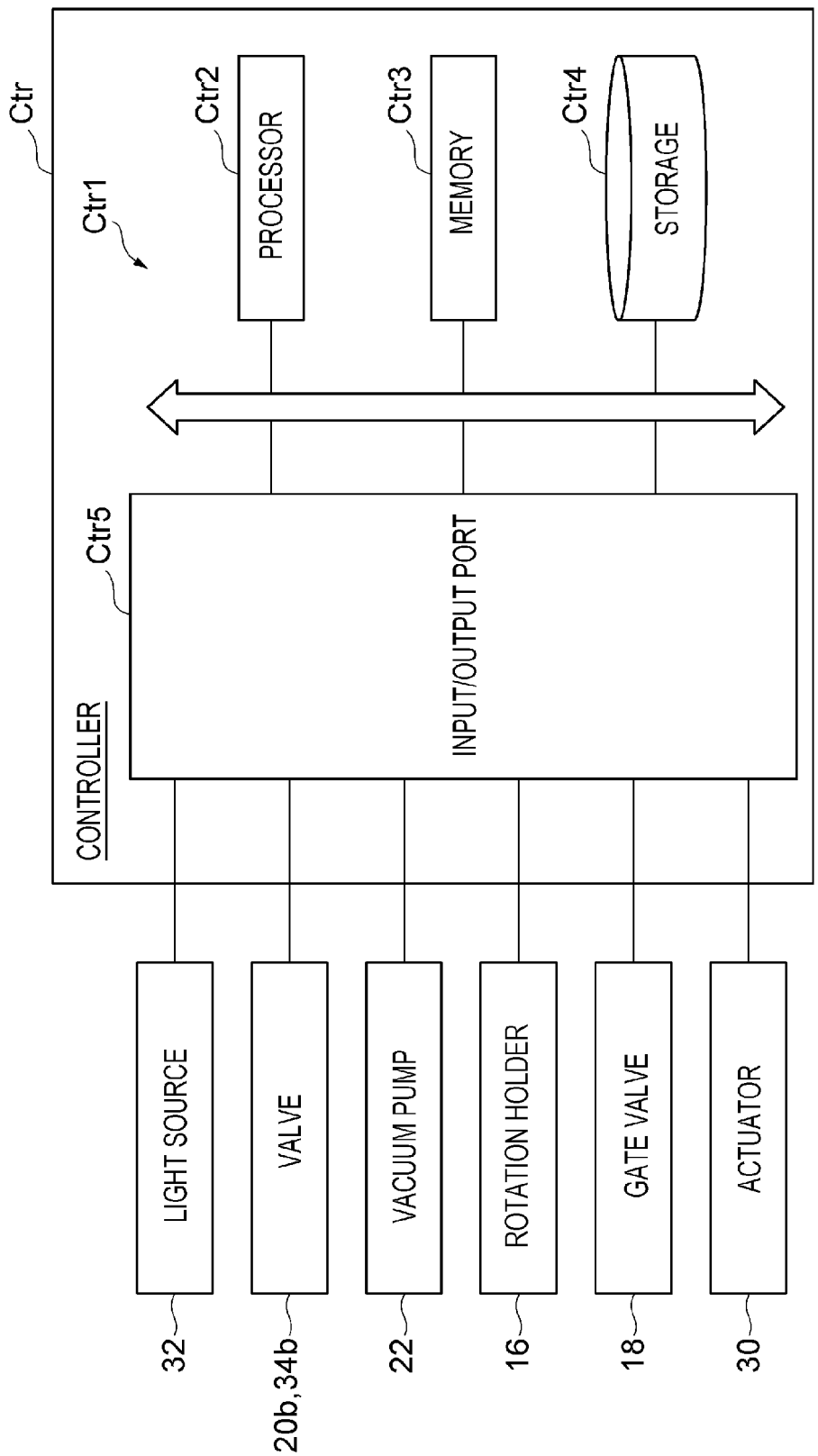
FIG. 5 is a schematic view illustrating a hardware configuration of a controller.

As illustrated in FIG. 4, the controller Ctr includes, as functional modules, a reader M1, a storage unit M2, a drive controller M3, a light source controller M4, a gas supply controller M5, and an exhaust controller M6. These functional modules are merely the functions of the controller Ctr divided into a plurality of modules for the sake of convenience, and do not necessarily mean that the hardware constituting the controller Ctr is divided into such modules. Each functional module is not limited to the one implemented by the execution of a program, but may be implemented by a dedicated electric circuit (e.g., a logic circuit) or an integrated circuit in which the electric circuit is integrated (ASIC: application specific integrated circuit).

The reader M1 has a function of reading a program from the computer-readable recording medium RM. The recording medium RM records a program that operates each part of the substrate processing apparatus 1. The recording medium RM may be, for example, a semiconductor memory, an optical recording disk, a magnetic recording disk, or a magneto-optical recording disk.

The storage unit M2 has a function of storing various data. The storage unit M2 stores, for example, a program read from the recording medium RM in the reader M1, various data when processing the wafer W (so-called processing recipe), and setting data input from an operator via an external input device (not illustrated).

The drive controller M3 has a function of controlling the rotation holder 16 so as to rotate the wafer W placed on the holding unit 16*c*. The drive controller M3 has a function of controlling the gate valve 18 so as to move the gate valve 18 between a position where the through hole 14*a* is closed and a position where the through hole 14*a* is opened. The drive controller M3 has a function of controlling the actuator 30 so as to move the shutter 28 between an open position where vacuum ultraviolet light from the light source 32 is irradiated onto the processing chamber 10 and a closed position where vacuum ultraviolet light from the light source 32 is blocked.

The light source controller M4 has a function of controlling the light source 32 such that vacuum ultraviolet light is irradiated from the light source 32.

The gas supply controller M5 has a function of controlling the valve 20*b* so as to supply an inert gas from the through hole 14*b* into the processing chamber 10 (into the housing 14). The gas supply controller M5 has a function of controlling the valve 34*b* so as to supply an inert gas from the through hole 24*a* into the light source chamber 12 (into the housing 24).

The exhaust controller M6 has a function of controlling the vacuum pump 22 so as to exhaust the gas in the processing chamber 10 (in the housing 14) to the outside through the through hole 14*c*.

The hardware of the controller Ctr is constituted by, for example, one or more control computers. The controller Ctr has, for example, a circuit Ctr1 illustrated in FIG. 5 as a hardware configuration. The circuit Ctr1 may be composed of electrical circuitry. Specifically, the circuit Ctr1 includes a processor Ctr2, a memory Ctr3 (storage unit), a storage Ctr4 (storage unit), and an input/output port Ctr5. The processor Ctr2 cooperates with at least one of the memory Ctr3 and the storage Ctr4 to execute a program and execute input/output of signals via the input/output port Ctr5 so as to configure each functional module described above.

The substrate processing apparatus 1 may include one controller Ctr, or may include a controller group (controller) including a plurality of controllers Ctr. When the substrate processing apparatus 1 includes the controller group, each of the functional modules described above may be implemented by one controller Ctr, or may be implemented by a combination of two or more controllers Ctr. When the controller Ctr is constituted by a plurality of computers (circuit Ctr1), each of the above functional modules may be implemented by one computer (circuit Ctr1), or may be implemented by a combination of two or more computers (circuit Ctr1). The controller Ctr may have a plurality of processors Ctr2. In this case, each of the functional modules described above may be implemented by one processor Ctr2 or may be implemented by a combination of two or more processors Ctr2.

<Substrate Processing Method>

Subsequently, a substrate processing method using the substrate processing apparatus 1 will be described with reference to FIGS. 6 to 10. Meanwhile, in the initial state, the wafer W does not exist in the processing chamber 10, the gate valve 18 opens the through hole 14*a* (the processing chamber 10 is open to the atmosphere), the shutter 28 is in a closed position, and the operations of the gas supplies 20 and 34 and the vacuum pump 22 are stopped.

Figure 6:
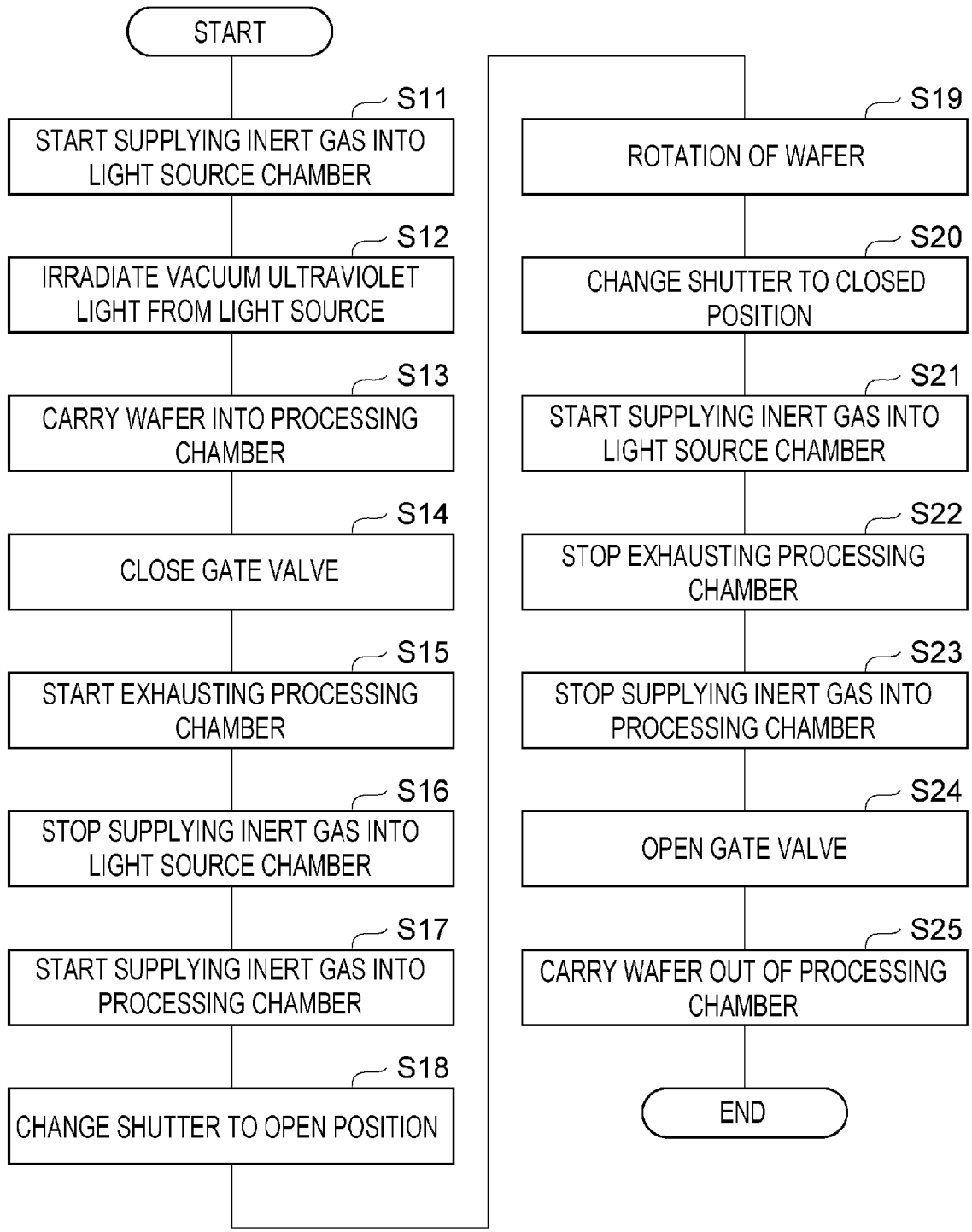
FIG. 6 is a flowchart illustrating an example of a wafer processing procedure.
Figure 7A:
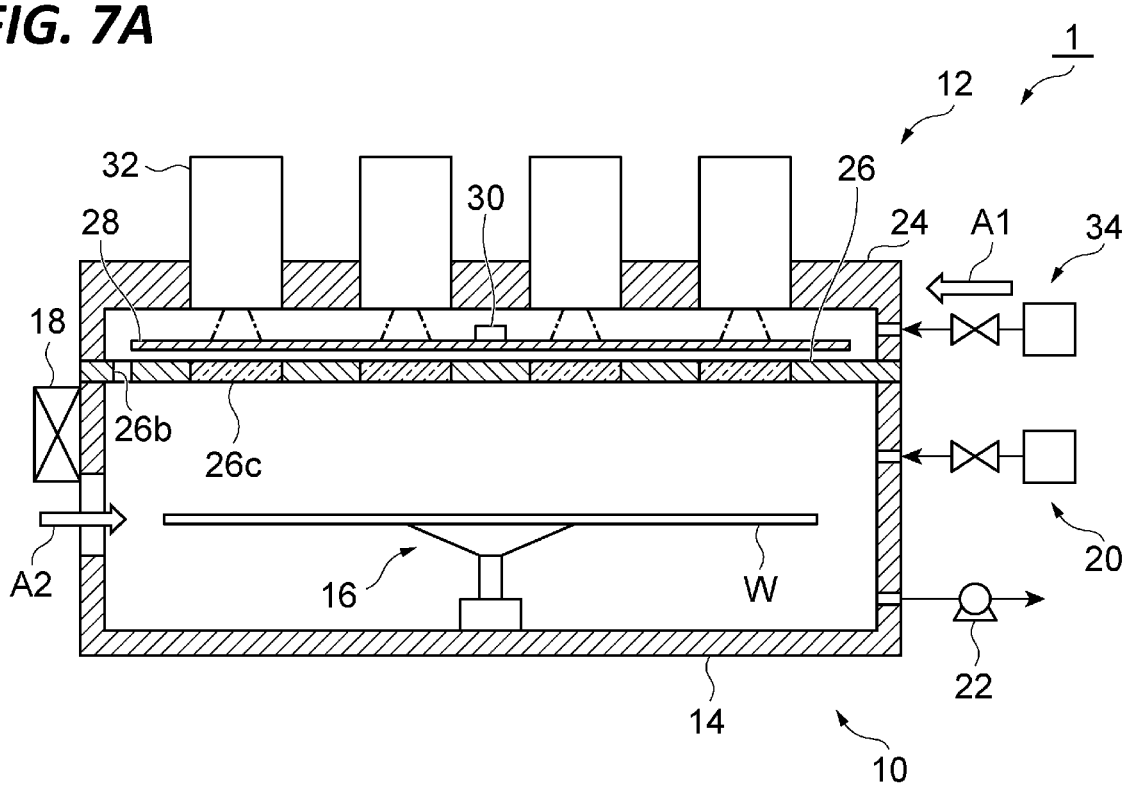
FIGS. 7A and 7B are views for explaining an example of the wafer processing procedure.

First, the controller Ctr controls the gas supply 34 (valve 34*b*) to supply an inert gas into the light source chamber 12 (into the housing 24) (see step S11 in FIG. 6 and the arrow "A1" in FIG. 7A). As a result, the inside of the light source chamber 12 is filled with the inert gas. After flowing through the space V, the inert gas in the light source chamber 12 flows into the processing chamber 10 through the through holes 26*b*.

Next, the controller Ctr controls the light source 32 to irradiate vacuum ultraviolet light (see step S12 in FIG. 6 and FIG. 7A). At this time, since the shutter 28 is in the closed position and the inside of the light source chamber 12 is filled with the inert gas, the vacuum ultraviolet light is less likely to react with oxygen.

Next, the controller Ctr controls a transfer mechanism not illustrated (e.g., a robot hand) so as to carry the wafer W into the processing chamber 10 (see step S13 in FIG. 6 and the arrow "A2" in FIG. 7A). Thus, the wafer W is held on the holding unit 16*c*. Meanwhile, since the inside of the processing chamber 10 is made vacuum in the subsequent process, the wafer W is not vacuum-sucked by the holding unit 16*c* but is simply mounted on the holding unit 16*c*.

Figure 7B:
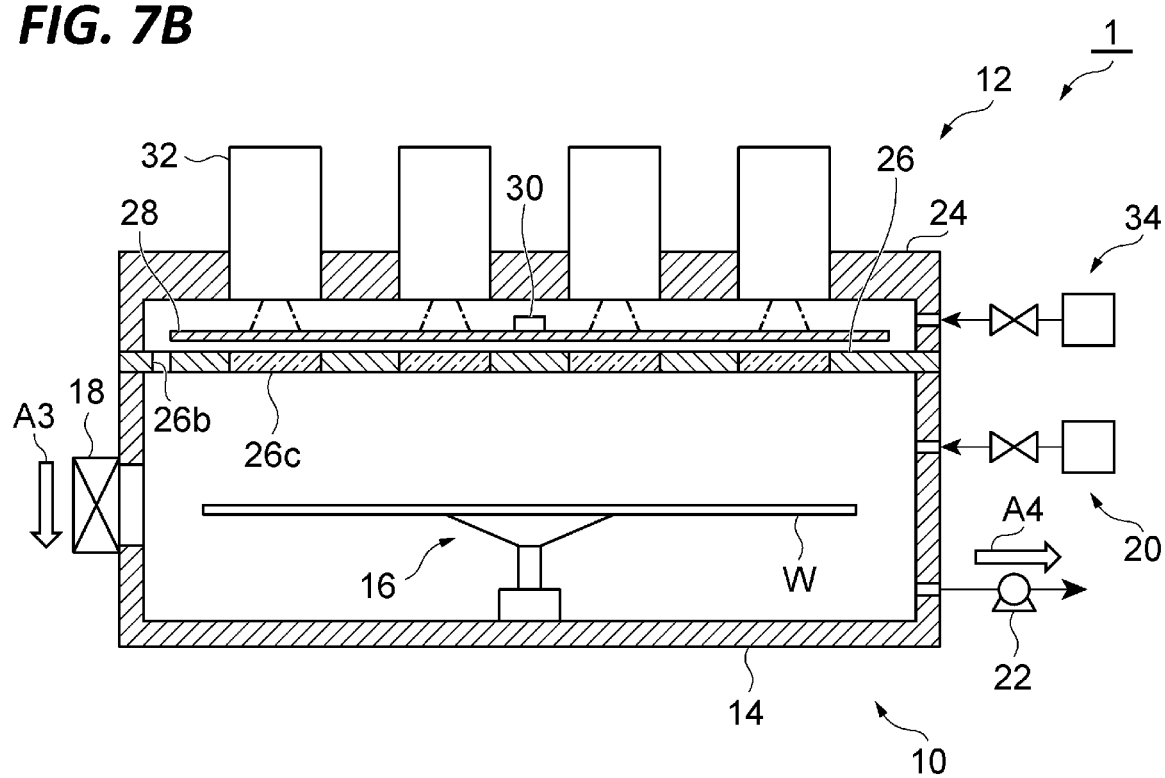

Subsequently, the controller Ctr controls the gate valve 18 so as to close the through hole 14*a* (see step S14 in FIG. 6 and the arrow "A3" in FIG. 7B). Next, the controller Ctr controls the vacuum pump 22 so as to exhaust the processing chamber 10 and make the inside of the processing chamber 10 in a vacuum state (see step S15 in FIG. 6 and the arrow "A4" in FIG. 7B).

Subsequently, the controller Ctr controls the gas supply 34 (valve 34*b*) to stop supplying the inert gas into the light source chamber 12 (see step S16 in FIG. 6 and FIG. 7B). During this time, making the processing chamber 10 in a vacuum state by the vacuum pump 22 is continuously performed, and the pressure in the processing chamber 10 is reduced from the atmospheric pressure to a pressure according to the performance of the vacuum pump 22 (see FIG. 10). The pressure at this time may be, for example, 0.5 Pa or less.

Figure 8A:
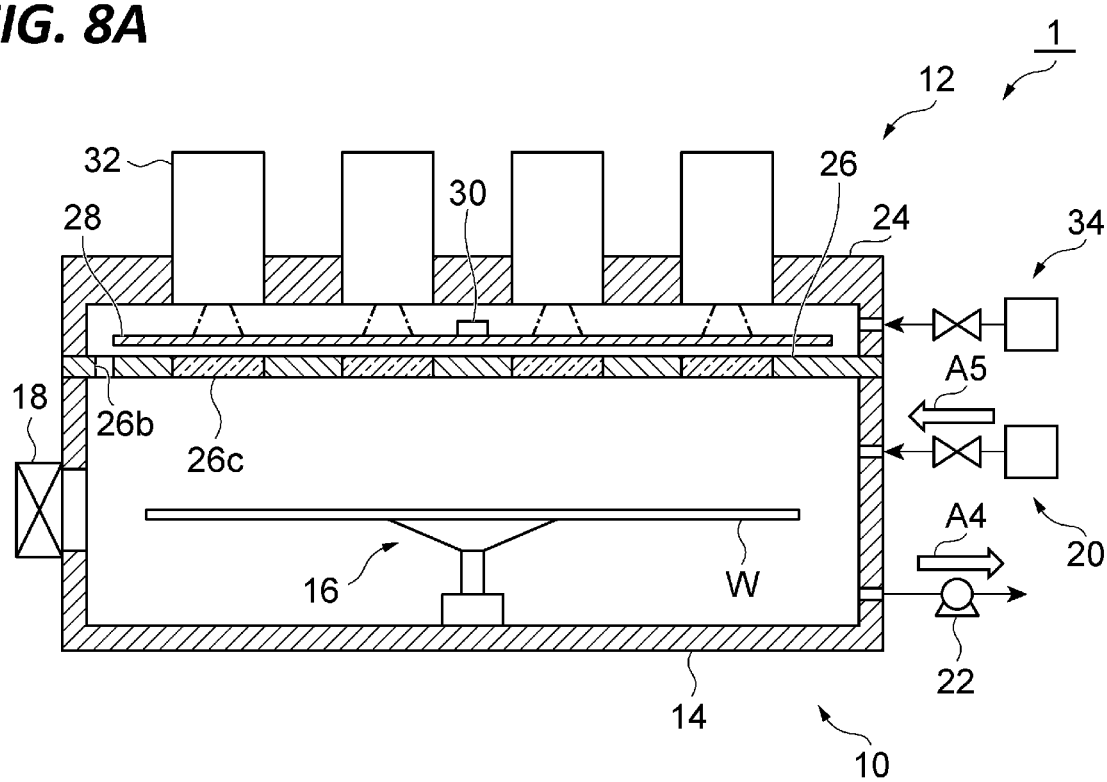
FIGS. 8A and 8B are views for explaining an example of the wafer processing procedure.

Subsequently, the controller Ctr controls the gas supply 20 (valve 20b) so as to supply the inert gas into the processing chamber 10 (into the housing 14) (see step S17 in FIG. 6 and the arrow "A5" in FIG. 8A). As a result, the pressure in the processing chamber 10 is increased to a set pressure (see FIG. 10), and the oxygen concentration in the processing chamber 10 is adjusted to be extremely low. The oxygen concentration at this time may be, for example, 50 ppm or less, or 20 ppm or less.

Figure 8B:
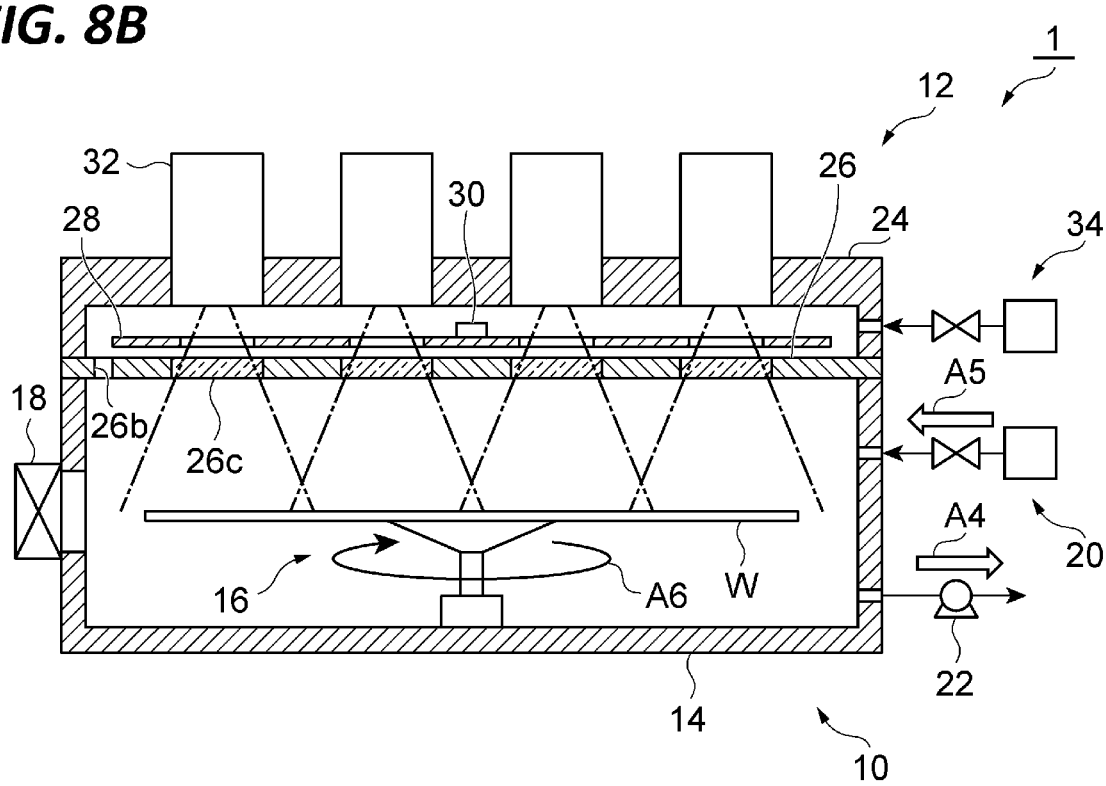

Subsequently, the controller Ctr controls the actuator 30 such that the shutter 28 is in the open position (see step S18 in FIG. 6 and FIG. 8B). As a result, the vacuum ultraviolet light from the light source 32 passes through the through holes 26a and 28a and the window member 26c and is irradiated onto the surface of the wafer W (see FIG. 8B).

Subsequently, the controller Ctr controls the rotation holder 16 (rotating unit 16a) to rotate the wafer W at the set number of rotations (see step S19 in FIG. 6 and the arrow "A6" in FIG. 8B). As a result, vacuum ultraviolet light is irradiated substantially uniformly over the entire surface of the wafer W. The number of rotations of the wafer W at this time may be, for example, about 10 rpm to 30 rpm. The number of rotations of the wafer W may be, for example, one or more.

Figure 9A:
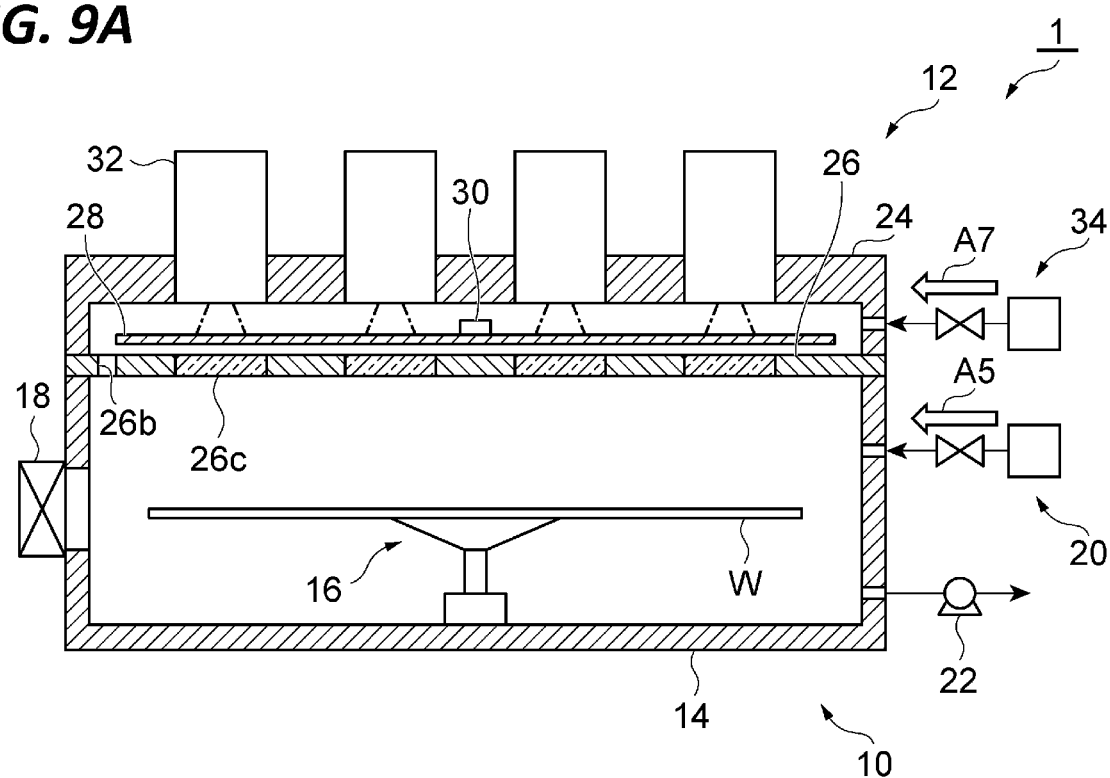
FIGS. 9A and 9B are views for explaining an example of the wafer processing procedure.

Subsequently, the controller Ctr controls the actuator 30 such that the shutter 28 is in the closed position (see step S20 in FIG. 6 and FIG. 9A). Thus, the vacuum ultraviolet light from the light source 32 is blocked by the shutter 28 and is not irradiated onto the processing chamber 10.

Subsequently, the controller Ctr controls the gas supply 34 (valve 34b) so as to supply the inert gas into the light source chamber 12 (into the housing 24) (see step S21 in FIG. 6 and the arrow "A7" in FIG. 9A). At this time, supplying the inert gas into the processing chamber 10 is continued in the gas supply 20.

Subsequently, the controller Ctr controls the vacuum pump 22 to stop the exhaust of the processing chamber 10 (see step S22 in FIG. 6 and FIG. 9A). At this time, since the inert gas is continuously supplied into the processing chamber 10 and the light source chamber 12, the pressure in the processing chamber 10 is increased (see FIG. 10).

Figure 9B:
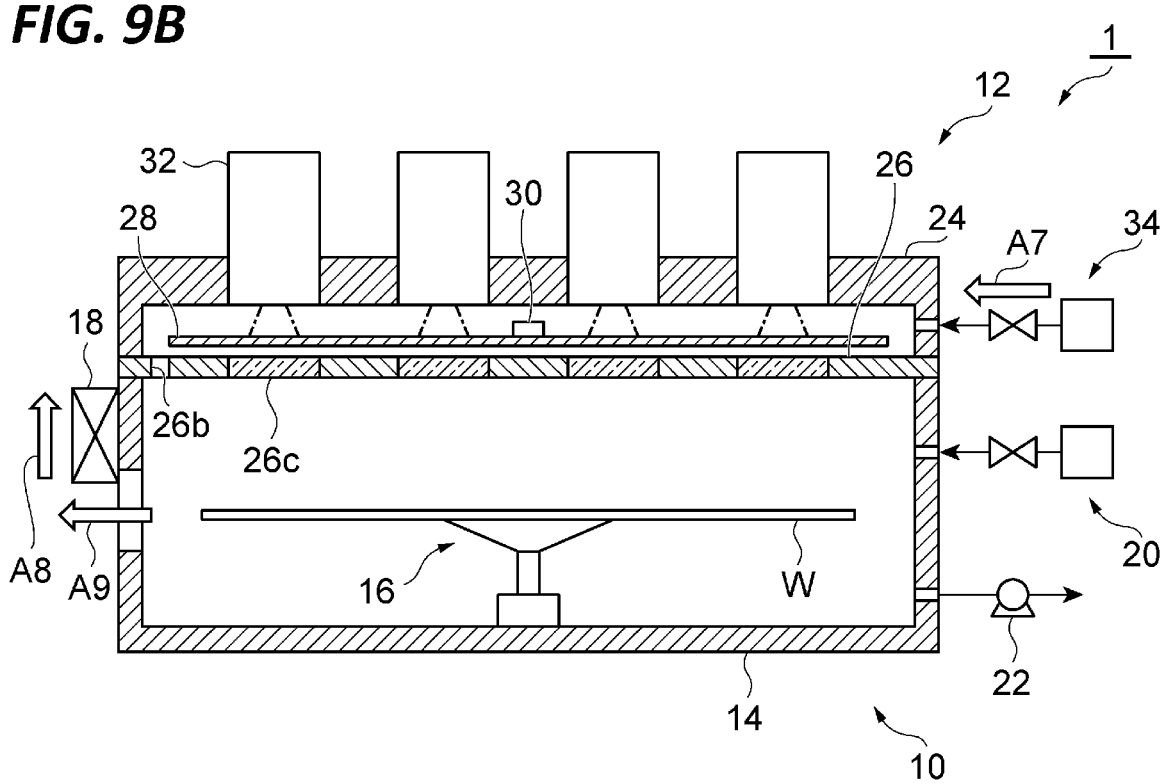
Figure 10:
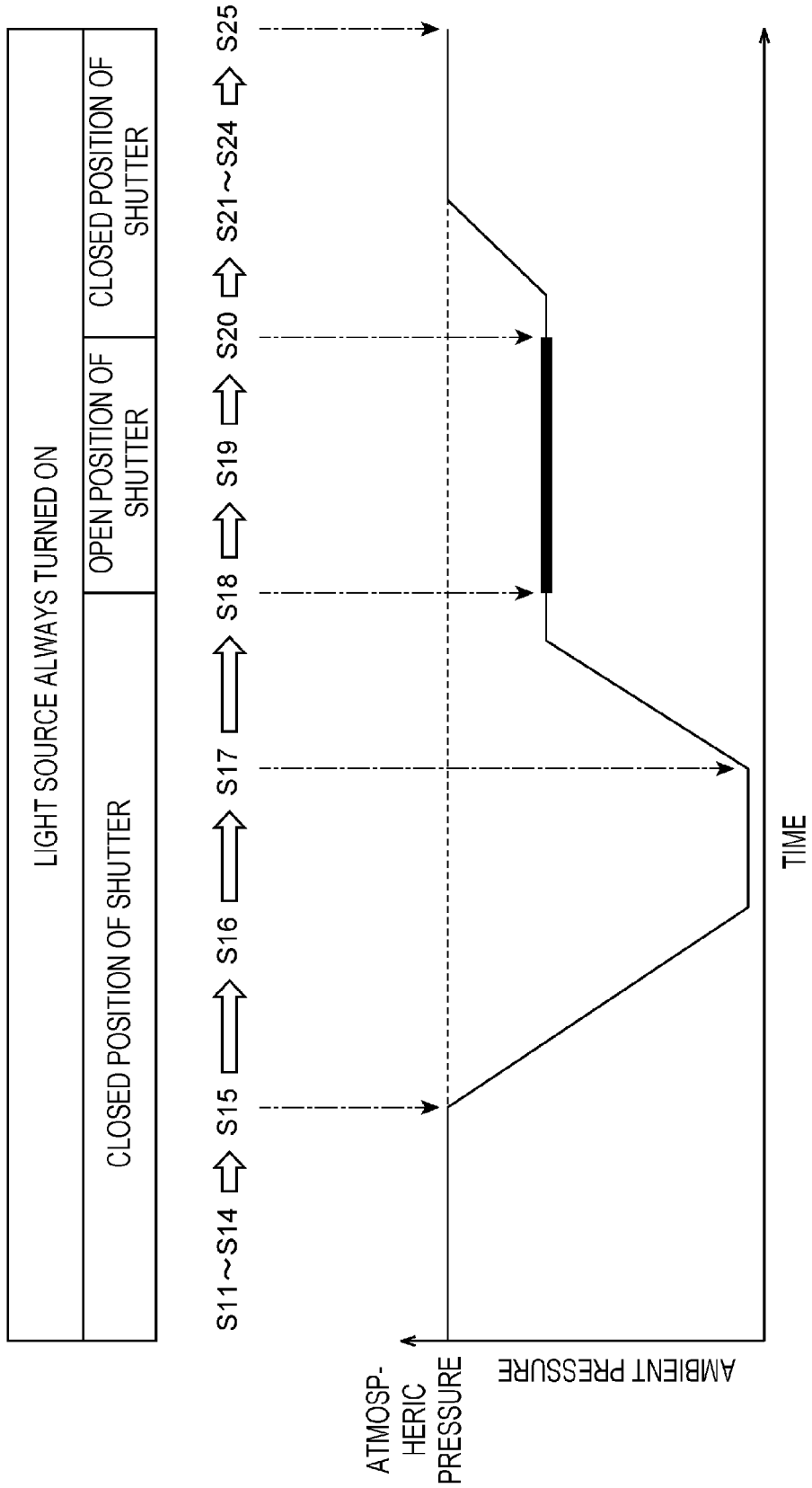
FIG. 10 is a view for explaining how the pressure in a processing chamber changes in accordance with the progress of processing.

Subsequently, when the pressure in the processing chamber 10 becomes equal to the atmospheric pressure, the controller Ctr controls the gas supply 20 (valve 20b) to stop supplying the inert gas into the processing chamber 10 (see step S23 in FIG. 6 and FIG. 9B). Meanwhile, supplying the inert gas into the light source chamber 12 is continued in the gas supply 34.

Subsequently, the controller Ctr controls the gate valve 18 so as to open the through hole 14a (see step S24 in FIG. 6 and the arrow "A8" in FIG. 9B). Thus, the processing chamber 10 is opened to the atmosphere. Next, the controller Ctr controls a transfer mechanism not illustrated (e.g., a robot hand) so as to carry the wafer W out of the processing chamber 10 (see step S25 in FIG. 6 and the arrow "A9" in FIG. 9B). Thereafter, while maintaining a state in which the vacuum ultraviolet light is irradiated from the light source 32, step S12 of FIG. 6 is omitted and the above-described process is repeated. Thus, the process is continuously performed on the plurality of wafers W.

[Action]

In the above-described embodiment, the inside of the light source chamber 12 is always in the inert gas atmosphere during the processing of the wafer W by the substrate processing apparatus 1. Thus, even when the processing chamber 10 is open to the atmosphere at the time of loading and unloading the wafer W and oxygen flows into the processing chamber 10, oxygen is suppressed from reacting with vacuum ultraviolet light and turning into ozone. Therefore, the light source 32 of vacuum ultraviolet light, which generally requires time to start up at the time of lighting, may always be turned on during the processing of the wafer W. As a result, the wafer W may be efficiently processed while suppressing the generation of ozone.

In the above-described embodiment, the through hole 26b is provided in the partition wall 26 to fluidly connect the processing chamber 10 and the light source chamber 12. Thus, the inert gas in the light source chamber 12 may flow to the processing chamber 10 through the through hole 26b. Therefore, since the inert gas supplied into the light source chamber 12 flows into the processing chamber 10 through the through hole 26b, oxygen is less likely to flow into the light source chamber 12. As a result, it becomes possible to further suppress the generation of ozone.

In the above-described embodiment, the inert gas is supplied to the light source chamber 12 by the gas supply 34 at least when the vacuum pump 22 is stopped (see steps S11 to S16 and S21 to S25 in FIG. 6). Since the light source chamber 12 is also exhausted through the through hole 26b during operation of the vacuum pump 22, oxygen is less likely to flow into the light source chamber 12. Meanwhile, since the inert gas is supplied from the gas supply 34 into the light source chamber 12 while the vacuum pump 22 is stopped, the inert gas is filled in the light source chamber 12 and oxygen is suppressed from reacting with vacuum ultraviolet light and turning into ozone. As described above, it is possible to reduce the amount of used inert gas by controlling the gas supply 34 in accordance with the operation of the vacuum pump 22.

In the above-described embodiment, the inert gas is supplied to the light source chamber 12 by the gas supply 34 at least when the processing chamber 10 is open to the atmosphere (see steps S11 to S14, S24, and S25 in FIG. 6). In this case, even when the processing chamber 10 is open to the atmosphere and oxygen flows into the processing chamber 10, since the inside of the light source chamber 12 is in the inert gas atmosphere, oxygen is less likely to react with vacuum ultraviolet light in the light source chamber 12. As a result, it becomes possible to further suppress the generation of ozone.

In the above-described embodiment, when the inside of the processing chamber 10 is returned to the atmospheric pressure, the inert gas is supplied to the inside of the processing chamber 10 and the inside of the light source chamber 12, respectively (see step S21 in FIG. 6). Therefore, when the processing chamber 10 is open to the atmosphere, oxygen is less likely to flow into the processing chamber 10 as well as the light source chamber 12. As a result, it becomes possible to further suppress the generation of ozone.

In the above-described embodiment, the space V in the light source chamber 12 is a flat space having a relatively small height in the vertical direction. In this case, the inert gas supplied into the light source chamber 12 by the gas supply 34 flows in the space V in the direction along the surface of the wafer W. Thus, the inert gas flowing in the light source chamber 12 is less likely to stay in the vertical direction. Therefore, even when oxygen is present in the light source chamber 12, the oxygen is accompanied with the inert gas and flows immediately to the downstream side where the vacuum ultraviolet light is not irradiated. As a result, it becomes possible to further suppress the generation of ozone.

[Modification]

The embodiments disclosed herein are illustrative and non-restrictive in every respect. The embodiments described above may be omitted, substituted, or changed in various forms without departing from the scope of the appended claims and the subject matter thereof.

(1) The inert gas may be supplied into the light source chamber 12 so that the pressure in the light source chamber 12 becomes higher than the pressure in the processing chamber 10. In this case, since the gas is like to flow from the light source chamber 12 toward the processing chamber 10 through the through hole 26b, oxygen is less likely to flow into the light source chamber 12. Therefore, it becomes possible to further suppress the generation of ozone.

(2) The through hole 26b may not be provided in the partition wall 26. In this case, the substrate processing apparatus 1 may further include an exhaust unit that exhausts the light source chamber 12.

(3) The gas supply 34 may always supply an inert gas into the light source chamber 12 during the operation of the substrate processing apparatus 1.

(4) The inert gas supplied into the processing chamber 10 when vacuum ultraviolet light is irradiated onto the wafer W is argon, and the inert gas supplied into the processing chamber 10 when the processing chamber 10 is returned to the atmospheric pressure may be argon or nitrogen. Alternatively, when the processing chamber 10 is returned to the atmospheric pressure, a gas other than the inert gas may be supplied into the processing chamber 10.

(5) The shutter 28 may change its posture between the open position and the closed position by sliding in a direction along the main surface of the partition wall 26 (horizontal direction).

(6) The substrate processing apparatus 1 may further include a sensor (measurer) configured to measure the oxygen concentration in the processing chamber 10. In this case, the timing at which the shutter 28 is changed to the open position (see step S20 in FIG. 6) may be the time in which the controller Ctr determines that the concentration measured by the sensor is equal to or less than a target value. Alternatively, a relationship between the time elapsed since the operation of the vacuum pump 22 performed to make the processing chamber 10 in a vacuum state and the oxygen concentration in the processing chamber 10 is acquired in advance, and the shutter 28 may be changed to the open position when the time in which the oxygen concentration in the processing chamber 10 becomes equal to or less than the target value has elapsed. In these cases, vacuum ultraviolet light is irradiated into the processing chamber 10 in a state where the oxygen concentration in the processing chamber 10 is low. Therefore, even when vacuum ultraviolet light and oxygen react in the processing chamber 10, it becomes possible to suppress the concentration of generated ozone sufficiently low.

Figure 11:
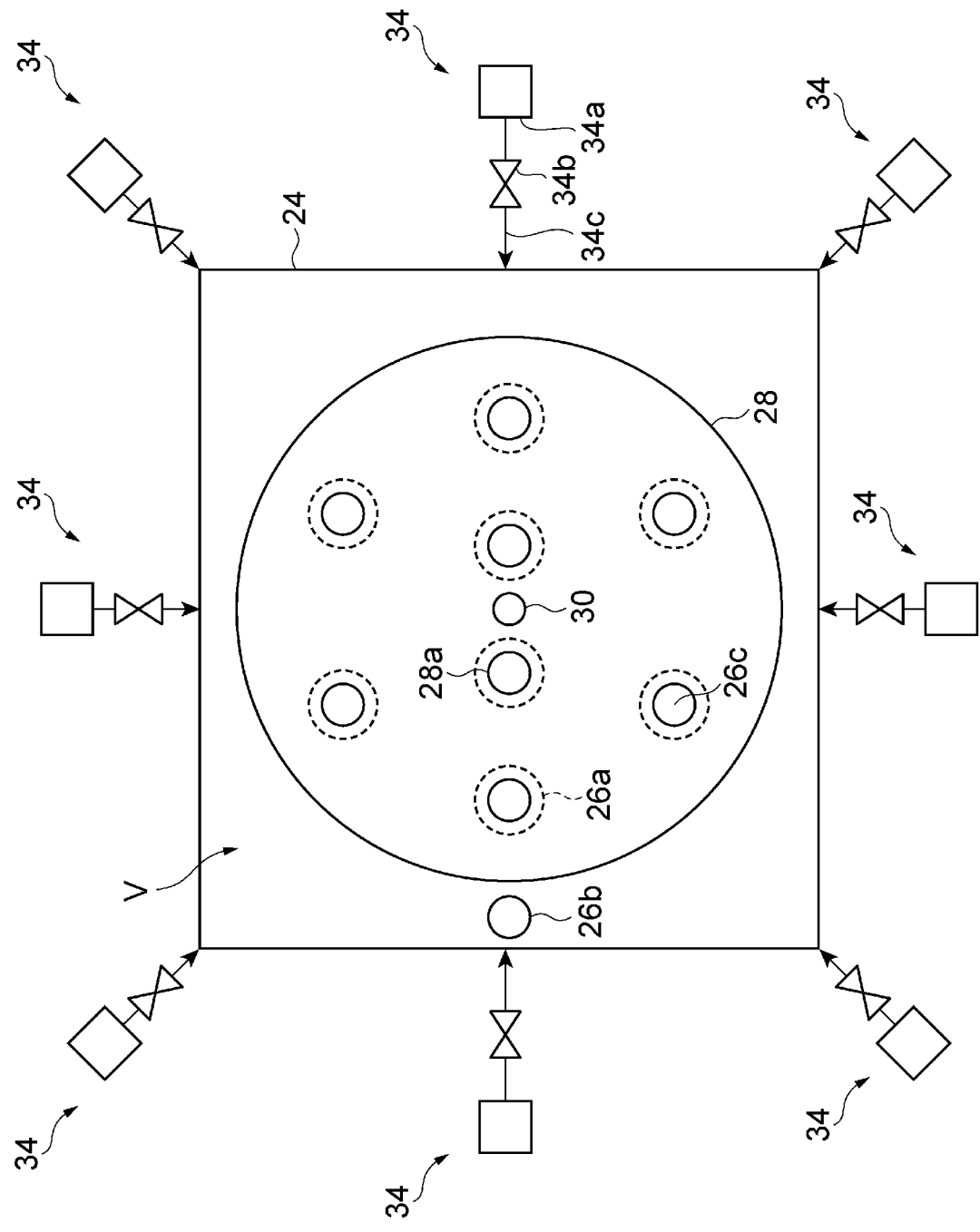
FIG. 11 is a top view of a lamp chamber of a substrate processing apparatus according to another example.

(7) As illustrated in FIG. 11, the substrate processing apparatus 1 includes a plurality of gas supplies 34 and the inert gas may be supplied into the processing chamber 10 from a plurality of directions around the processing chamber 10.

(8) The position of the through hole 26b may be a position which does not overlap with the wafer W in the vertical direction, as illustrated in FIG. 2. In this case, the gas that has flowed into the processing chamber 10 through the through hole 26b is less likely to directly face the wafer W.

Figure 12:
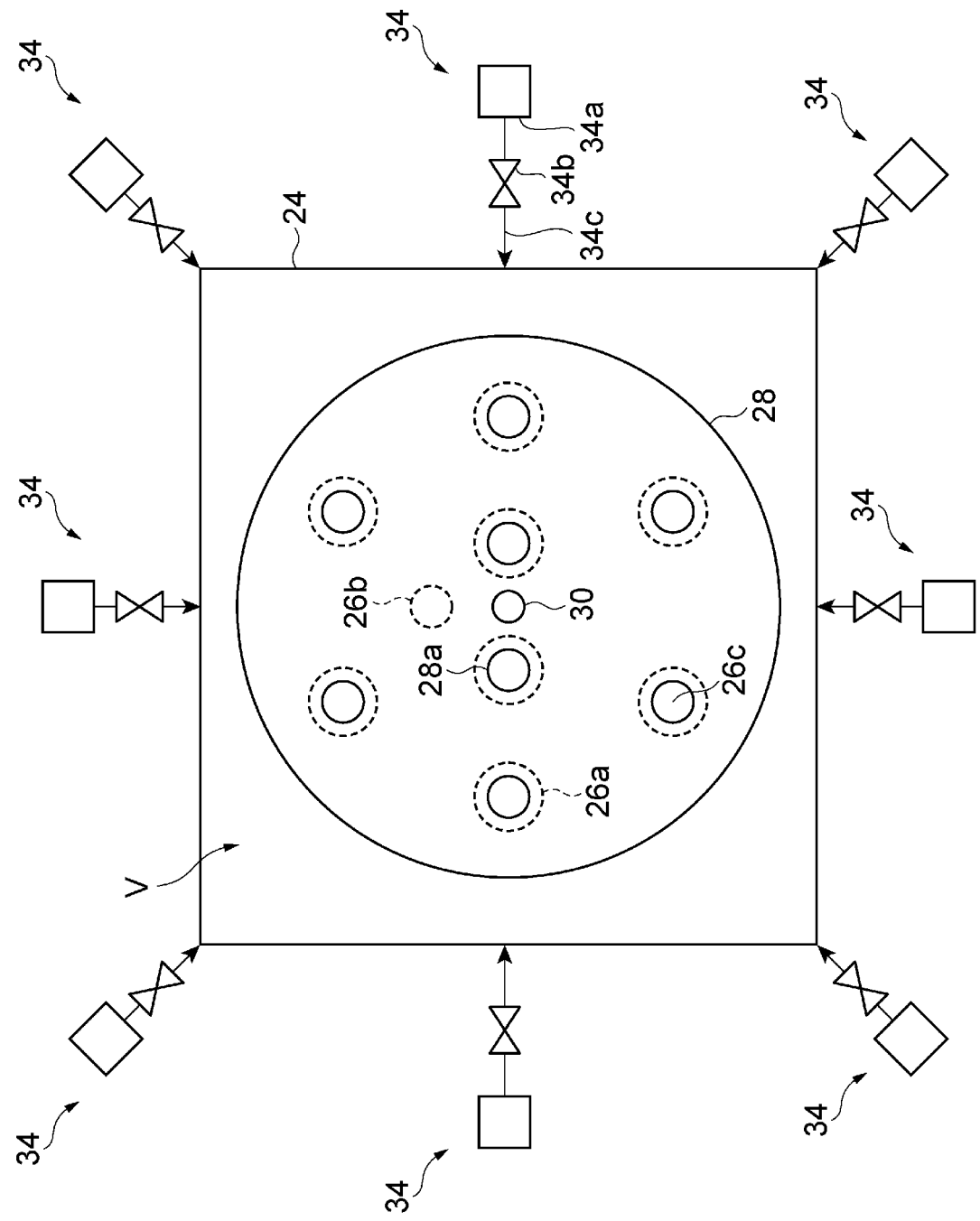
FIG. 12 is a top view of a lamp chamber of a substrate processing apparatus according to still another example.

Alternatively, the position of the through hole 26b may be near the center of the partition wall 26 as illustrated in FIG. 12.

EXAMPLE

When the substrate is carried into and out of the processing chamber, since the processing chamber is open to the atmosphere, oxygen flows into the processing chamber. At this time, as in the method described in Patent Document 1, when light having a wavelength of 200 nm or less remains irradiated, oxygen may react with light to generate ozone. Not only does ozone have a possibility of affecting the resist film formed on the surface of the substrate, but ozone also has a possibility of affecting the human body. Thus, the concentration of ozone is regulated below a predetermined reference value. Therefore, in the related art, it has been common practice to turn off the light source before opening the processing chamber to the atmosphere, and to carry out a process of turning on the light source after the substrate is carried into the processing chamber and the processing chamber is made in a vacuum state.

However, this type of light source may take a relatively long time to start up. Therefore, it has been difficult to improve substrate processing efficiency.

Therefore, descriptions will be made below on an example of a substrate processing apparatus capable of efficiently processing a substrate while suppressing the generation of ozone.

Example 1. A substrate processing apparatus according to an example of the present disclosure includes: a processing chamber configured to process a substrate; a light source chamber including a light source configured to irradiate vacuum ultraviolet light onto a surface of the substrate; a gas supply configured to supply an inert gas into the light source chamber; and a controller configured to control the gas supply to maintain the light source chamber in an inert gas atmosphere. In this case, the light source chamber is always in an inert gas atmosphere during the operation of the apparatus. Thus, even when the processing chamber 10 is open to the atmosphere at the time of loading and unloading the wafer W and oxygen flows into the processing chamber 10, oxygen is suppressed from reacting with vacuum ultraviolet light and turning into ozone. Therefore, the light source of vacuum ultraviolet light, which generally requires time to start up at the time of lighting, may always be turned on during the operation of the apparatus. As a result, the substrate may be efficiently processed while suppressing the generation of ozone.

Example 2. The apparatus of example 1 may further include a flow path that fluidly connects the processing chamber and the light source chamber. In this case, the inert gas in the light source chamber may flow to the processing chamber through the flow path. Therefore, since the inert gas supplied into the light source chamber flows into the processing chamber through the flow path, oxygen is less likely to flow into the light source chamber. As a result, it becomes possible to further suppress the generation of ozone.

Example 3. The apparatus of example 2 further includes: an exhaust section including a pump configured to exhaust a gas from the processing chamber. The controller may control the gas supply and the exhaust unit such that the inert gas is supplied into the light source chamber at least when the exhaust section is stopped. Since the light source chamber is also exhausted through the flow path during the operation of the exhaust unit, oxygen is less likely to flow into the light source chamber. Meanwhile, since the inert gas is supplied from the gas supply into the light source chamber during stoppage of the exhaust section, the inert gas is filled in the light source chamber and oxygen is suppressed from reacting with vacuum ultraviolet light and turning into ozone. As described above, it becomes possible to reduce the amount of used inert gas by controlling the gas supply in accordance with the operation of the exhaust section.

Example 4. In the apparatus of example 2 or 3, the controller may control the gas supply such that the pressure in the light source chamber becomes higher than the pressure in the processing chamber when the inert gas is supplied into the light source chamber. In this case, since the gas is likely to flow from the light source chamber toward the processing chamber through the flow path, oxygen is less likely to flow into the light source chamber. Therefore, it becomes possible to further suppress the generation of ozone.

Example 5. In the apparatus according to any one of examples 1 to 4, the controller may control the gas supply such that an inert gas is supplied into the light source chamber at least when the processing chamber is open to the atmosphere. In this case, even when the processing chamber is open to the atmosphere and oxygen flows into the processing chamber, since the inside of the light source chamber is in the inert gas atmosphere, oxygen is less likely to react with vacuum ultraviolet light in the light source chamber. As a result, it becomes possible to further suppress the generation of ozone.

Example 6. In the apparatus according to any one of examples 1 to 5, the controller may control the gas supply such that an inert gas is supplied into the light source chamber and the processing chamber. In this case, when the processing chamber is open to the atmosphere, it is difficult for oxygen to flow into the processing chamber as well as the light source chamber. As a result, it becomes possible to further suppress the generation of ozone.

Example 7. In the apparatus of any one of examples 1 to 6, the light source chamber includes a shutter disposed in the light source chamber so as to be located between the light source and the substrate. The shutter is configured to be movable between a closed position where vacuum ultraviolet light from the light source is not caused to reach the substrate and an open position where vacuum ultraviolet light from the light source is caused to pass through the substrate. The controller may control the shutter such that the shutter is brought into an open position when the oxygen concentration in the processing chamber is equal to or lower than the target value. In this case, vacuum ultraviolet light is irradiated into the processing chamber in a state where the oxygen concentration in the processing chamber is low. Therefore, even when vacuum ultraviolet light and oxygen react with each other in the processing chamber, it becomes possible to suppress the concentration of generated ozone sufficiently low.

Example 8. In the apparatus of any of examples 1 to 7, the light source chamber has a flat space having a relatively small height in the direction orthogonal to the surface of the substrate, and the inert gas supplied into the light source chamber by the gas supply may flow in a direction along the surface of the substrate. In this case, the inert gas flowing in the light source chamber is less likely to stay in the direction orthogonal to the surface of the substrate. Therefore, even when oxygen is present in the light source chamber, the oxygen is accompanied with the inert gas and flows immediately to the downstream side where the vacuum ultraviolet light is not irradiated. As a result, it becomes possible to further suppress the generation of ozone.

The substrate processing apparatus according to an embodiment may efficiently process the substrate while suppressing the generation of ozone.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a processing chamber configured to perform a processing on a substrate;
    a light source chamber including a light source configured to irradiate a surface of the substrate with vacuum ultraviolet light and a shutter disposed in the light source chamber so as to be located between the light source and the substrate;
    a partition wall configured to partition the processing chamber and the light source chamber, the partition wall having a plurality of wall through holes disposed therein;
    a gas supply configured to supply an inert gas into the light source chamber; and
    a controller configured to control the gas supply to maintain the light source chamber in an inert gas atmosphere,
    wherein each wall through hole includes a window configured to close each wall through hole and transmit the vacuum ultraviolet light,
    the shutter is configured to be movable between a closed position where vacuum ultraviolet light from the light source does not reach the substrate and an open position where vacuum ultraviolet light from the light source passes through the substrate, and
    the controller controls the shutter such that the shutter is brought into the open position when an oxygen concentration in the processing chamber is equal to or lower than a target value.

2. The substrate processing apparatus according to claim 1, further comprising:
    a flow path that fluidly connects the processing chamber and the light source chamber.

3. The substrate processing apparatus according to claim 2, further comprising:
    an exhaust section including a pump configured to exhaust a gas from the processing chamber,
    wherein the controller controls the gas supply and the exhaust section such that the inert gas is supplied into the light source chamber when the exhaust section is stopped.

4. The substrate processing apparatus according to claim 3, wherein the controller controls the gas supply such that a pressure in the light source chamber becomes higher than a pressure in the processing chamber when the inert gas is supplied into the light source chamber.

5. The substrate processing apparatus according to claim 4, wherein the controller controls the gas supply such that the inert gas is supplied into the light source chamber when the processing chamber is open to an atmosphere.

6. The substrate processing apparatus according to claim 5, wherein the controller controls the gas supply such that the inert gas is supplied into the light source chamber and the processing chamber.

7. The substrate processing apparatus according to claim 6, wherein the light source chamber has a flat space having a height in a direction orthogonal to the surface of the substrate smaller than a width of the flat space, and
the inert gas supplied into the light source chamber by the gas supply flows in a direction along the surface of the substrate.

8. The substrate processing apparatus according to claim 2, wherein the controller controls the gas supply such that a pressure in the light source chamber becomes higher than a pressure in the processing chamber when the inert gas is supplied into the light source chamber.

9. The substrate processing apparatus according to claim 1, wherein the controller controls the gas supply such that the inert gas is supplied into the light source chamber when the processing chamber is open to an atmosphere.

10. The substrate processing apparatus according to claim 1, wherein the controller controls the gas supply such that the inert gas is supplied into the light source chamber and the processing chamber.

11. The substrate processing apparatus according to claim 1, wherein the light source chamber has a flat space having a height in a direction orthogonal to the surface of the substrate smaller than a width of the flat space, and
the inert gas supplied into the light source chamber by the gas supply flows in a direction along the surface of the substrate.

12. The substrate processing apparatus according to claim 1, wherein each window is glass.

13. The substrate processing apparatus according to claim 12, wherein the shutter includes a plurality of shutter through holes, the shutter through holes configured to overlap the wall through holes when the shutter is in the open position.

14. A substrate processing apparatus comprising:
a processing chamber configured to perform a processing on a substrate;
a light source chamber including a light source configured to irradiate a surface of the substrate with vacuum ultraviolet light and a shutter disposed in the light source chamber so as to be located between the light source and the substrate;
a partition wall configured to partition the processing chamber and the light source chamber, the partition wall having a plurality of wall through holes disposed therein;
a gas supply configured to supply an inert gas into the light source chamber; and
a controller configured to control the gas supply to maintain the light source chamber in an inert gas atmosphere,
wherein each wall through hole includes a window configured to close each wall through hole and transmit the vacuum ultraviolet light,
the shutter is configured to be movable between a closed position where vacuum ultraviolet light from the light source does not reach the substrate and an open position where vacuum ultraviolet light from the light source passes through the substrate, and
the controller controls the gas supply such that the inert gas is supplied into the light source chamber when the processing chamber is open to an atmosphere.

15. The substrate processing apparatus according to claim 14, further comprising:
a flow path that fluidly connects the processing chamber and the light source chamber.

16. The substrate processing apparatus according to claim 15, further comprising:
an exhaust section including a pump configured to exhaust a gas from the processing chamber,
wherein the controller controls the gas supply and the exhaust section such that the inert gas is supplied into the light source chamber when the exhaust section is stopped.

17. The substrate processing apparatus according to claim 16, wherein the controller controls the gas supply such that a pressure in the light source chamber becomes higher than a pressure in the processing chamber when the inert gas is supplied into the light source chamber.

\* \* \* \* \*